(12) United States Patent
Lucas Morata

(10) Patent No.: US 9,196,777 B2
(45) Date of Patent: Nov. 24, 2015

(54) ZENITHAL ROTATION MODULE FOR ORIENTING SOLAR PANELS

(75) Inventor: Francisco Lucas Morata, Barcelona (ES)

(73) Assignee: TGB Rodamientos, S.L., Sant Cugat Sesgarrigues (Barcelona) (ES)

( * ) Notice: Subject to any disclaimer, the term of this patent is extended or adjusted under 35 U.S.C. 154(b) by 70 days.

(21) Appl. No.: 14/237,606

(22) PCT Filed: Aug. 10, 2011

(86) PCT No.: PCT/ES2011/070592
§ 371 (c)(1),
(2), (4) Date: Feb. 10, 2014

(87) PCT Pub. No.: WO2013/021075
PCT Pub. Date: Feb. 14, 2013

(65) Prior Publication Data
US 2014/0174502 A1    Jun. 26, 2014

(51) Int. Cl.
| | |
|---|---|
| *F16H 1/12* | (2006.01) |
| *F16H 1/20* | (2006.01) |
| *F16H 57/02* | (2012.01) |
| *F16H 57/04* | (2010.01) |

(Continued)

(52) U.S. Cl.
CPC ............ *H01L 31/052* (2013.01); *F16C 19/166* (2013.01); *F16C 19/181* (2013.01); *F16C 33/6677* (2013.01); *F16H 1/16* (2013.01); *F24J 2/5403* (2013.01); *F16C 33/60* (2013.01); *F24J 2002/5462* (2013.01); *Y02E 10/47* (2013.01)

(58) Field of Classification Search
CPC ................. F24J 2002/5462; F24J 2002/5482; F24J 2/5417; F24J 2002/5465; H02S 20/00; Y02E 10/47; Y02E 10/722; F16H 57/039; F16H 57/027; F16H 57/029; F16H 57/031; F16H 57/0463; F16H 57/0498; F16C 33/581; F16C 43/06
USPC ................................ 74/416, 425, 439, 606 R
See application file for complete search history.

(56) References Cited

U.S. PATENT DOCUMENTS 4,906,113 A * 3/1990 Sague ........................... 384/618
4,961,653 A * 10/1990 Suzuki et al. ................. 384/447

(Continued)

FOREIGN PATENT DOCUMENTS

| CN | 201232734 Y | 5/2009 |
|---|---|---|
| CN | 201377547 Y | 1/2010 |

(Continued)

*Primary Examiner* — William Kelleher
*Assistant Examiner* — Jake Cook
(74) *Attorney, Agent, or Firm* — McNees Wallace & Nurick LLC

(57) ABSTRACT

Capable of supporting large radial loads due to heavy panels, with a simplified assembly but without compromise in terms of precision and robustness. It comprises an annular structural casing (1), a toothed crown (2) mounted in the structural casing (1), whereon an endless screw (3) actuated by a motor (4) tangentially meshes, the toothed crown (2) of which comprises a central annular protuberance (5) with a toothing that meshes with the endless screw (3), and the circular projections (6) of which of the body of the toothed crown (2) comprise a plurality of threaded holes (7) for connecting the horizontal shafts that support the solar panels for their zenithal orientation, where the toothed crown (2) comprises a toothed track whereon the endless screw (3) tangentially meshes, and two independent raceways.

6 Claims, 5 Drawing Sheets

(51) Int. Cl.
  *F16H 61/00* (2006.01)
  *H01L 31/052* (2014.01)
  *F16H 1/16* (2006.01)
  *F24J 2/54* (2006.01)
  *F16C 19/16* (2006.01)
  *F16C 19/18* (2006.01)
  *F16C 33/66* (2006.01)
  *F16C 33/60* (2006.01)

(56) References Cited

U.S. PATENT DOCUMENTS

| | | | | |
|---|---|---|---|---|
| 5,104,239 A | * | 4/1992 | Sague | 384/448 |
| 5,834,662 A | * | 11/1998 | Stoll et al. | 74/425 |
| 5,957,000 A | * | 9/1999 | Pecorari | 74/425 |
| 6,170,350 B1 | * | 1/2001 | Behm | 74/425 |
| 2003/0066370 A1 | * | 4/2003 | Russ et al. | 74/414 |
| 2006/0019789 A1 | * | 1/2006 | Kingston et al. | 475/116 |
| 2006/0280394 A1 | * | 12/2006 | Michioka et al. | 384/588 |
| 2010/0229678 A1 | | 9/2010 | Boeing et al. | |
| 2011/0126884 A1 | | 6/2011 | Dritsas | |

FOREIGN PATENT DOCUMENTS

| | | |
|---|---|---|
| CN | 102072281 A | 5/2011 |
| EP | 1150039 A2 | 10/2001 |
| EP | 2063200 A1 | 5/2009 |
| ES | 8206796 A1 | 11/1982 |
| ES | 2342688 T3 | 7/2010 |
| ES | 2354560 A1 | 3/2011 |
| FR | 2921705 A1 | 4/2009 |

* cited by examiner

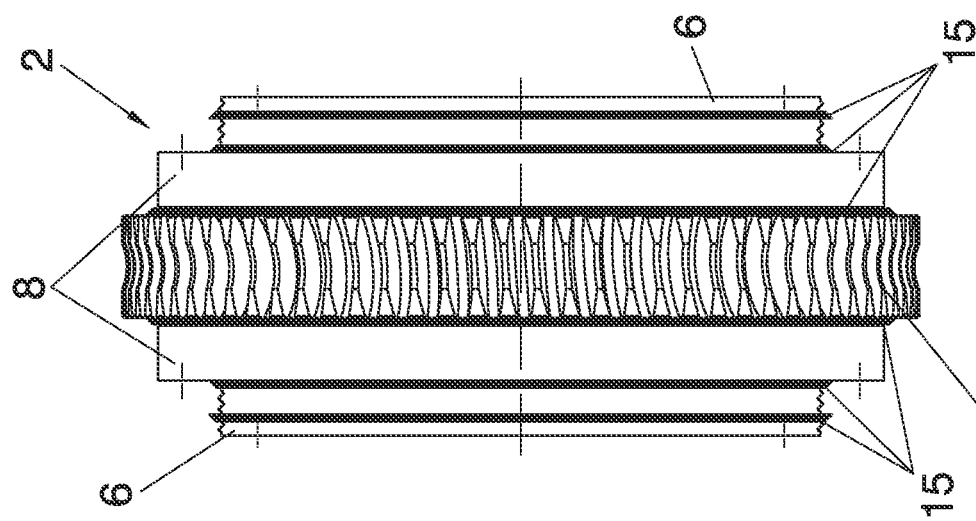
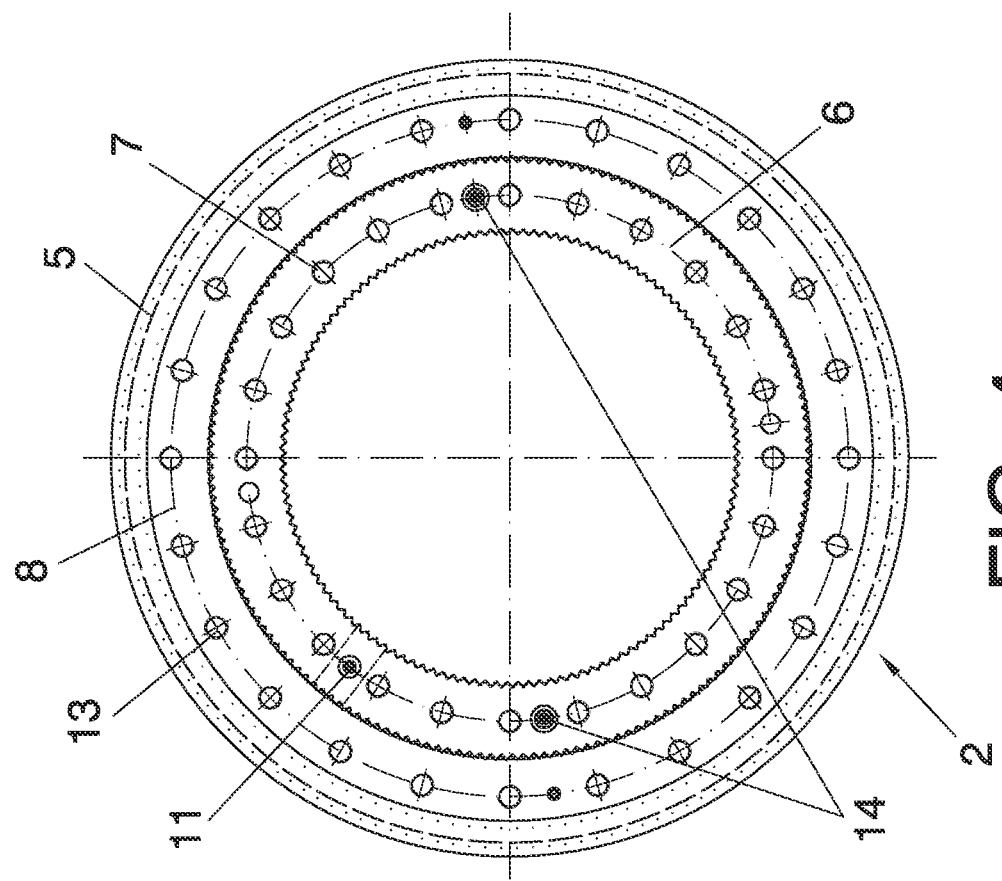

ZENITHAL ROTATION MODULE FOR ORIENTING SOLAR PANELS

OBJECT OF THE INVENTION

The present invention relates to a zenithal rotation module for orienting solar panels of large dimensions of the type composed of a structural casing of annular configuration, which houses a toothed crown whereon an endless screw actuated by a motor tangentially meshes.

The zenithal rotation module object of the invention is especially designed to support large radial loads due to the high weight of the solar panels. Therefore, the toothed crown comprises a toothed track whereon the endless screw tangentially meshes, and two independent raceways, especially designed for a perfect support of the toothed crown inside the casing, as well as a correct alignment of the shafts that support and orientate the solar panels.

BACKGROUND OF THE INVENTION

Due to energy requirements, especially electrical consumption, there is an ever increasing proliferation of the installation of solar panels for energy production. To enable a better use of the solar energy, these solar panels or trackers are provided with a rotation module for their solar orientation. Thanks to the motorization of these rotation modules, the solar panels are continually and automatically reoriented achieving a maximum output.

The rotation modules existing on the market are characterized in that they work, preferably, so that the largest part of the load is axial. A rotation module that must orientate a solar panel zenithally, receives mainly radial loads, so that a large part of the solar projects reject the use of standard rotation modules for zenithal orientation, choosing other means of orientation that are less precise such as linear actuators.

In the state of the art, the following references are known which describe rotation modules for orienting solar panels in their zenith and azimuth axes, jointly or independently:

Patent EP2063200 discloses a two-axis transmission which has independent power units for each axis. The axes are disposed so that they independently allow zenithal and azimuthal movement, the mechanism of which can be implemented in solar panels. As a noteworthy characteristic it discloses the use of a specific conical toothing which makes it possible to reduce the play between the crowns, when they are operating.

Patent US20100229678 discloses a two-axis mechanism with dual transmission and with two independent shafts disposed orthogonally.

Patent CN201232734 discloses a transmission mechanism for a heliostat, the mechanism of which is based on a toothed crown and a screw.

The rotation modules described in said references are not designed for supporting solar panels with large dimensions so that they do not support well the radial loads whereto the toothed crown is subjected. Indeed, the solar panels or surfaces are mounted on the orientation module, through two horizontal shafts, which are fixed on both sides of the toothed crown in a symmetrical and aligned fashion, for the rotation thereof, and therefore, the zenithal orientation of the panels. Therefore, the entire weight of the structure supported by the solar panels falls on the toothed crown, generating radial loads, proportional to the size and weight of the solar surface.

Another drawback of the current rotation modules is the complexity involved in their assembly within the structural casing, since it must guarantee the robustness of the unit, the perfect alignment of the horizontal shafts, as well as facilitating their subsequent maintenance. For an optimum energy output of the solar panel it must be constantly oriented in accordance with the position of the sun. This implies that the orientation module must act with extreme precision to achieve maximum use of the solar energy. Hence, the toothed crown must slide extremely gently within the structural casing, minimizing the friction and with a good greasing system. Most rotation modules comprise a single greasing system common to the endless screw and to the crown bearings, with the drawbacks that this entails, since the greasing requirements differ for each mechanism. The entry of impurities or foreign particles in the crown bearings may be very harmful for the rotation module and produce important alignments in the solar panels, which would negatively affect the energy output of the solar installation.

To achieve the maximum precision and robustness, all known rotation modules comprise a multitude of intermediate parts, such as bearings and their attachments to the casing and the crown which complicate their assembly, whilst hindering their later maintenance and repair.

DESCRIPTION OF THE INVENTION

The zenithal rotation module for orienting solar panels that the invention proposes resolves the aforementioned problem, as it perfectly supports the radial loads, whilst it allows an easy assembly and maintenance, and especially a good lubrication.

Therefore, and more specifically, the zenithal rotation module for orienting solar panels comprises a structural casing of annular configuration, a toothed crown mounted inside the structural casing whereon an endless screw actuated by a motor tangentially meshes, the toothed crown of which comprises a central annular protuberance whereon the toothing has been made that meshes with the endless screw, and the circular projections of which comprise a plurality of threaded holes for connecting the horizontal shafts that support the solar panels for their zenithal orientation. For the assembly and support of the toothed crown inside the structural casing, the zenithal rotation module comprises two circular rings, disposed one on each side of the annular protuberance of the toothed crown, on the lateral cylindrical surfaces of the circular projections of the body of the toothed crown, having disposed between them a plurality of ball bearings in different raceways of semicircular section, respectively made in different cylindrical surfaces of the body of the toothed crown, close to the walls of the central annular protuberance, and in the inner cylindrical surface of the circular rings, the ball bearings of which are introduced in the respective raceways through a duct made in the body of the toothed crown, which starts in the lateral edge of the cylindrical body of the toothed crown and ends in the raceway channel of the toothed crown, and the rings of which comprise a plurality of threaded holes in their outer lateral surfaces for their fixing to the structural casing of the rotation module.

In this way, the toothed crown is vertically mounted, i.e. with its rotation axis in horizontal position, inside the structural casing, through the two circular rings and the ball bearings, thus mainly supporting radial loads, and also axial and tilting moments through its four points of contact in each bearing. The radius of the raceways is appreciably greater than the radius of the ball bearings, so that four points of contact are established, two in each raceway, and better support the radial loads. The disposal of ball bearings under said circumstance offers these four points of contact not allowed by other rolling elements such as rollers, needles, etc.

The circular projections of the cylindrical body of the toothed crown emerge laterally on both sides of the structural casing of annular configuration, for connecting the horizontal shafts that support the solar panels for their zenithal orientation. In this way, as both horizontal shafts are directly mounted on the same part, in this case, the toothed crown, they are perfectly aligned and synchronized.

The ball bearings that allow the smooth sliding between the toothed crown and the structural casing, through the annular rings, are independently greased through at least one duct, which communicates the lateral edge of the cylindrical body of the toothed crown with the raceway channel, for the introduction from the outside of the lubricating grease.

On the other hand, the openings between the toothed crown and the circular rings comprise a set of circular seals inserted in different grooves made on the rings and the toothed crown to avoid the entry of impurities to the ball bearings and to make the greasing areas independent from the rotation module. In this way, each mesh will receive its lubricant independently without mixing, so that they will not spread the impurities or metal particles that may be given off by its own inner wear through the inside of the rotation module.

The structural casing of annular configuration comprises a circular inner opening with a diameter equivalent to the diameter of the circular projection of the body of the toothed crown, surrounded in its perimeter by a plurality of orifices disposed in a position coinciding with the threaded holes of the outer lateral surface of the circular ring, for their fixing to the structural casing. Said casing is closed at the other end by a circular cover provided with a circular opening with a diameter equivalent to the diameter of the cylindrical body of the crown, the cover of which comprises two series of orifices, one in its outer perimeter for its fixing by threaded screws to the body of the structural casing, and another in its inner perimeter coinciding with the threaded holes of the outer lateral surface of the other circular ring, for fixing the toothed crown to the structural casing through the circular cover.

The configuration of the structural casing and of the annular rings allows an easy assembly, maintenance and repair of the rotation module. First, the annular rings are mounted on the toothed crown making the respective raceways coincide, the ball bearings are introduced through the duct provided for this, and then it is mounted inside the structural casing. For this purpose, the mounted unit of the toothed crown is introduced with its rings through the main opening of the structural casing, until the circular projection of the cylindrical body of the toothed crown emerges through the opposite end, and is fixed by said face using set screws which fix the inner ring to the structural casing. Then, the structural casing is closed by the circular cover, placing the corresponding set screws in both series of orifices which fix the circular cover to the structural casing and to the outer annular ring for fixing the toothed crown by its outer face. This circular cover also serves to introduce a preload in the ball bearings by compression of the raceway on pretightening the set screws.

Finally, it should be indicated that the structural casing of annular configuration comprises a circular base disposed in orthogonal position with respect to the axis of rotation of the toothed crown, provided with a plurality of orifices in its outer perimeter for fixing to the main support mast of the solar panel, or to an axial rotation module.

DESCRIPTION OF THE DRAWINGS

To complement the description being made and in order to aid towards a better understanding of the characteristics of the invention, in accordance with a preferred example of practical embodiment thereof, a set of drawings is attached as an integral part of said description wherein, with illustrative and non-limiting character, the following has been represented:

FIG. 4.—Shows an elevational view of the toothed crown with the annular rings mounted wherein it is possible to observe the orifice for the introduction of the ball bearings and the greasing orifices.

FIG. 5.—Shows a profile view of the toothed crown with the annular rings mounted, wherein the placement of the circular airtight seals can be observed.

PREFERRED EMBODIMENT OF THE INVENTION

In light of figures described, a preferred embodiment is described below of the zenithal rotation module for orienting solar panels.

Figure 1:
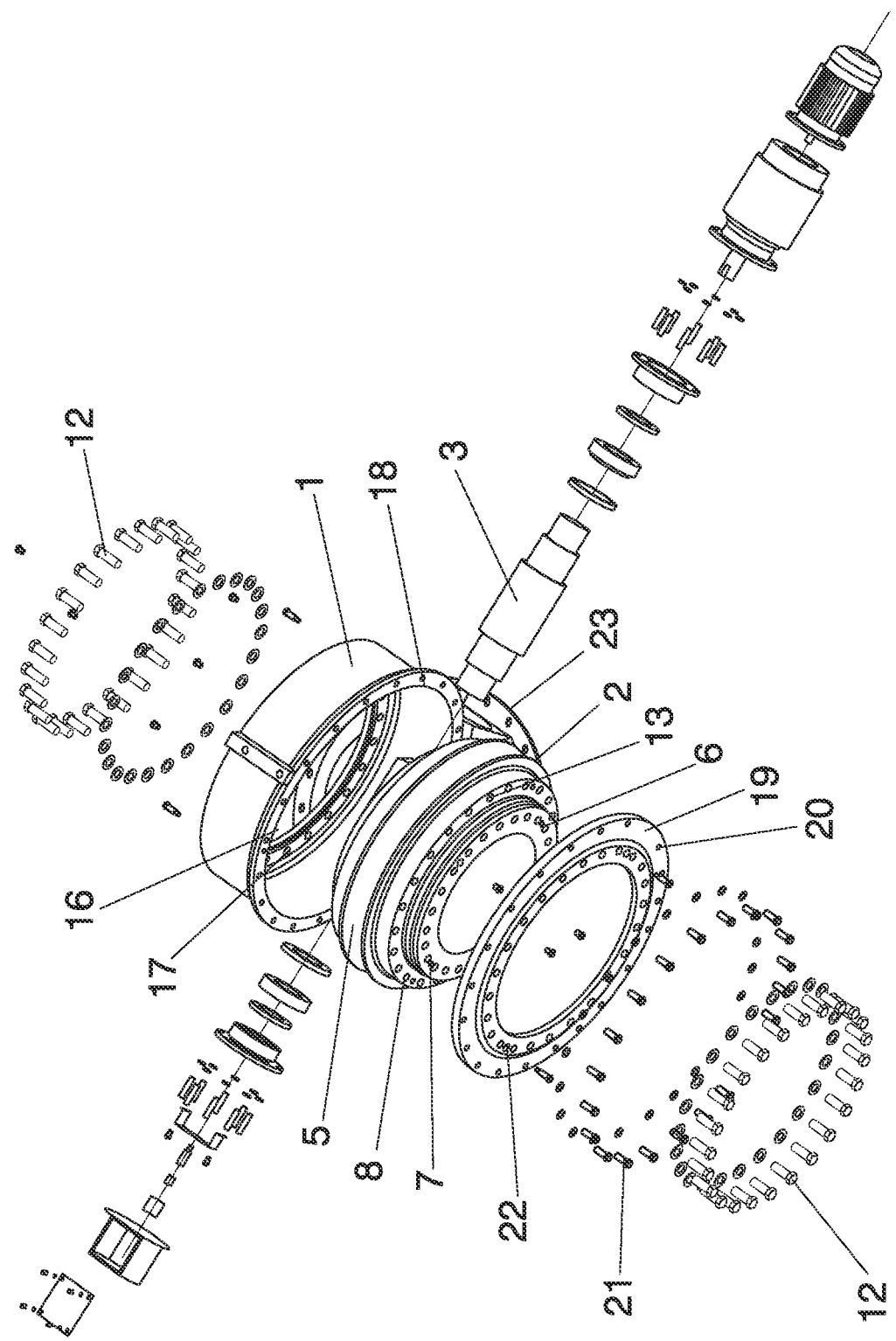
FIG. 1.—Shows an exploded perspective view of the zenithal rotation module for orienting solar panels, object of the present invention.

As can be observed in FIG. 1, the zenithal rotation module comprises a structural casing (1) of annular configuration, a toothed crown (2) disposed inside the structural casing (1), whereon an endless screw (3) actuated by an electric motor (4) tangentially meshes. Said electric motor (4) is governed by an electronic control panel, which actuates it in accordance with the position of the solar for the correct orientation of the solar panels, not represented in the drawings. The shaft of the electric motor (4) is connected to the endless screw (3) shaft, which makes the toothed crown (2) rotate according to its axial axis of rotation.

Figure 6:
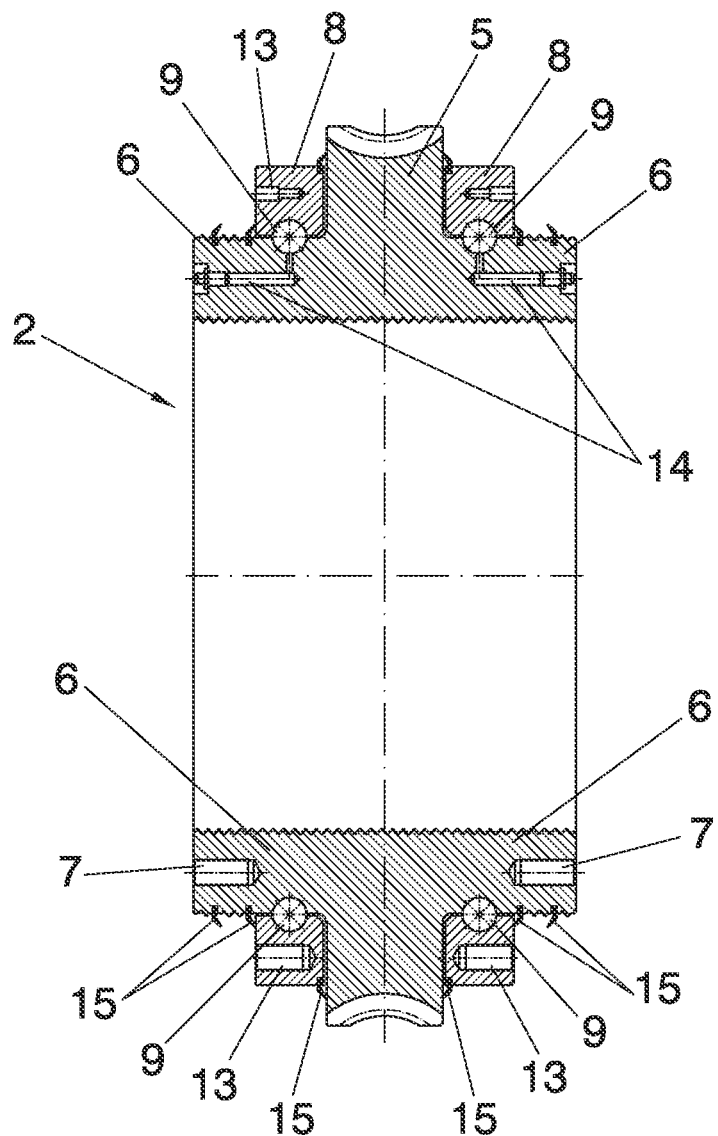
FIG. 6.—Shows a diameter section of the crown toothing with its annular rings wherein the greasing ducts of the ball bearings can be observed.
Figure 7:
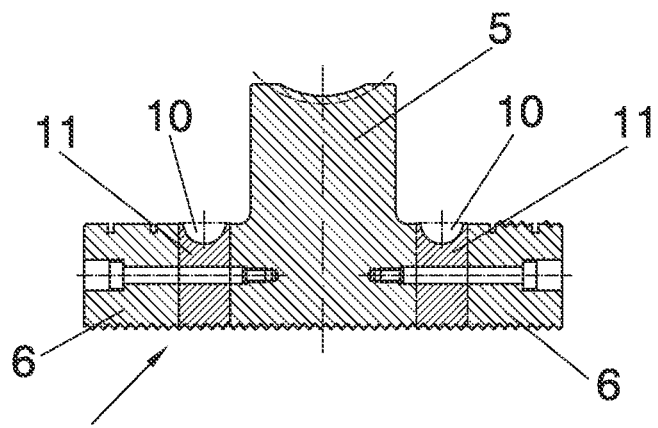
FIG. 7.—Shows a detailed view of a section of the toothed crown, in correspondence with the ball filling orifice.
Figure 8:
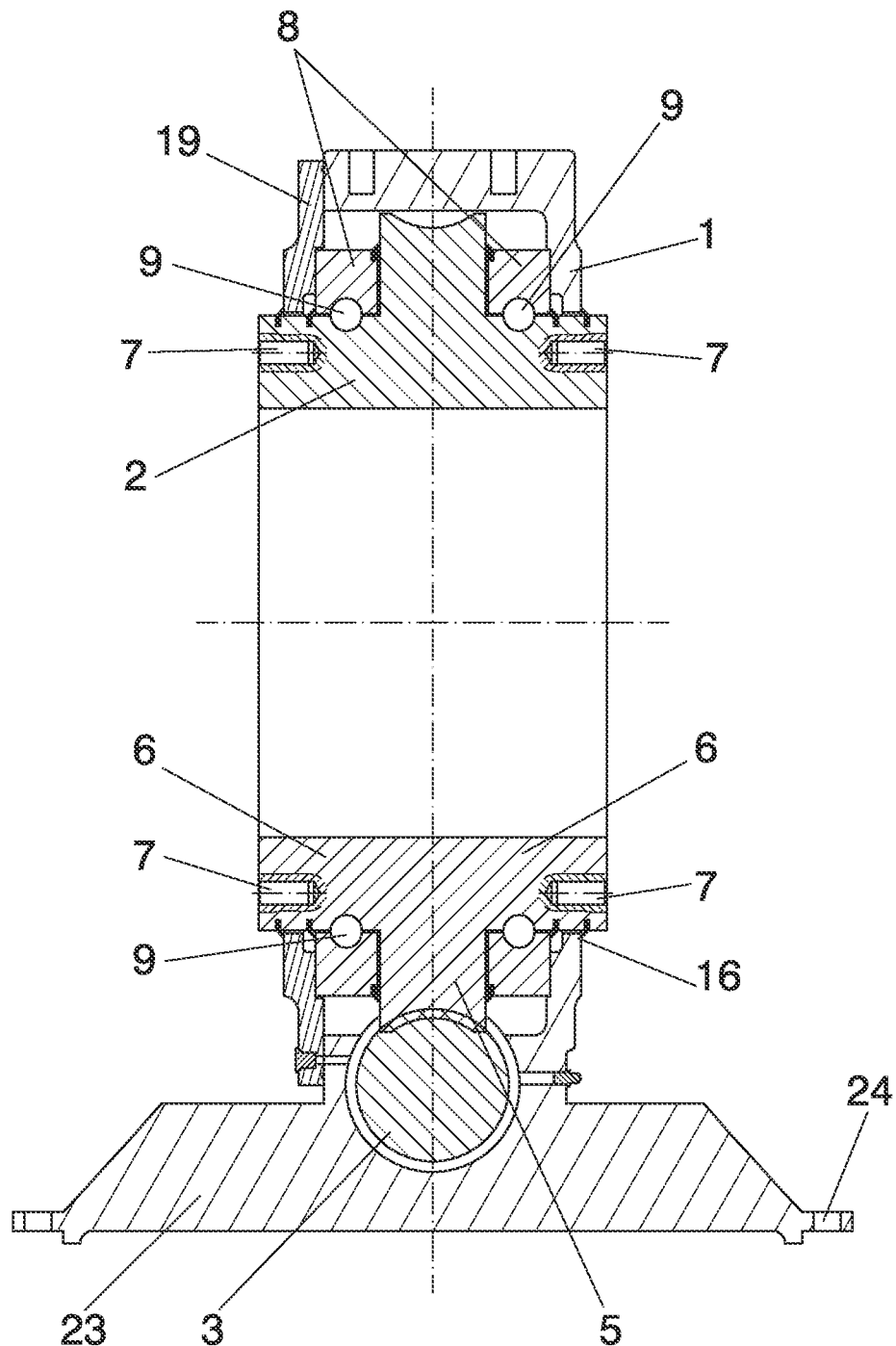
FIG. 8.—Shows a diameter section of the rotation module complete and mounted.

The toothed crown (2), as can be observed in FIGS. 4, 5 and 6, comprises a central annular protuberance (5) finished with the appropriate toothing for its meshing with the helical toothing of the endless screw (3), and two circular projections (6) which axially emerge from the body of the toothed crown (2), for fixing the horizontal shafts that support the solar panels, not represented in the drawings. The fixing of said shafts to the toothed crown (2) is performed using set screws that are inserted in the threaded holes (7) made in the front surface of the circular projections (6) of the body of the toothed crown (2). In this way, the two horizontal shafts are fixed one on each side of the toothed crown (2), guaranteeing their alignment.

The fastening of the toothed crown (2) inside the structural casing (1) is performed through two circular rings (8), disposed one on each side of the central annular protuberance (5) and on the cylindrical surfaces of the circular projections (6), between which a plurality of ball bearings (9) has been disposed in different semicircular channels (10) respectively made in different cylindrical surfaces of the annular projections (6), close to the walls of the central annular protuberance (5), and in the inner cylindrical surface of the circular rings (8). Since the circular rings (8) are tightly mounted on the circular projections (6), the body of the toothed crown (2) comprises two ducts (11) which start in the inner cylindrical surface of the toothed crown (2) and which end in the semicircular channels (10) of the raceways of the toothed crown (2) for the introduction of the ball bearings (9).

The unit formed by the toothed crown (2) and the circular rings (8) is mounted inside the structural casing (1) through the circular rings (8) using threaded screws (12) which are inserted in a plurality of threaded holes (13) made in the outer lateral surfaces of the circular rings (8). This disposal enables an easy and fast assembly of the toothed crown (2) within the structural casing (1).

For an easy assembly and alignment of the horizontal shafts that support the solar panels, not represented in the drawings, the circular projections (6) of the body of the toothed crown (2), emerge laterally on both sides of the structural casing (1).

The ball bearings (9) are greased through two ducts (14) which communicate the lateral edges of the circular projections (6) of the body of the toothed crown (2), with the semicircular channels of the raceways (10). These ducts are accessible from the outside of the mounted rotation module in order to perform their periodical greasing.

As can be observed in FIGS. 4 and 5, and with the aim of making the greasing zones independent and avoiding the entry of dirt and impurities in the ball raceways (9), the openings between the toothed crown (2) and the circular rings (8) comprise sets of circular seals (15), inserted in different grooves for their fixing in said position.

Figure 2:
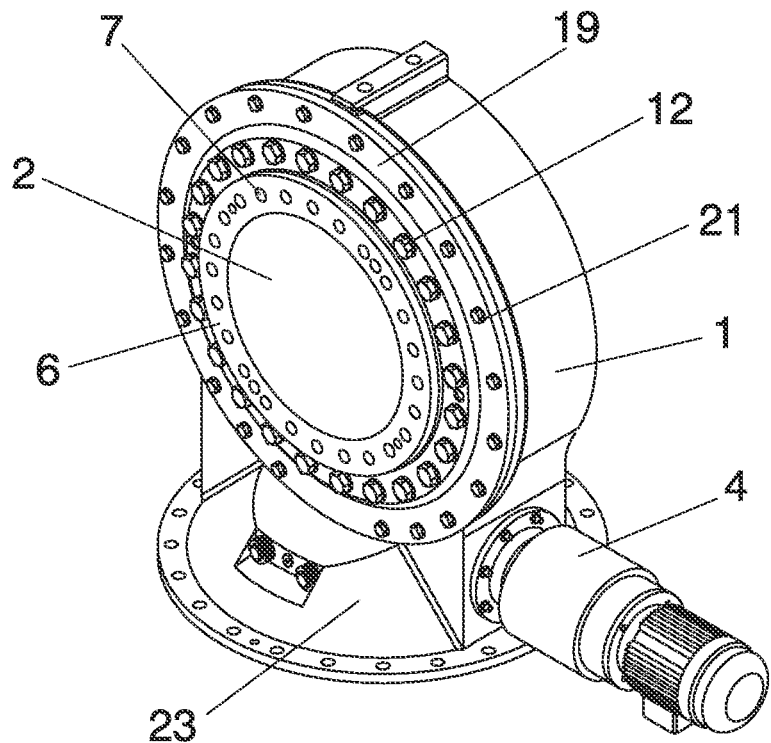
FIG. 2.—Shows a perspective view of the front face of the rotation module properly mounted.
Figure 3:
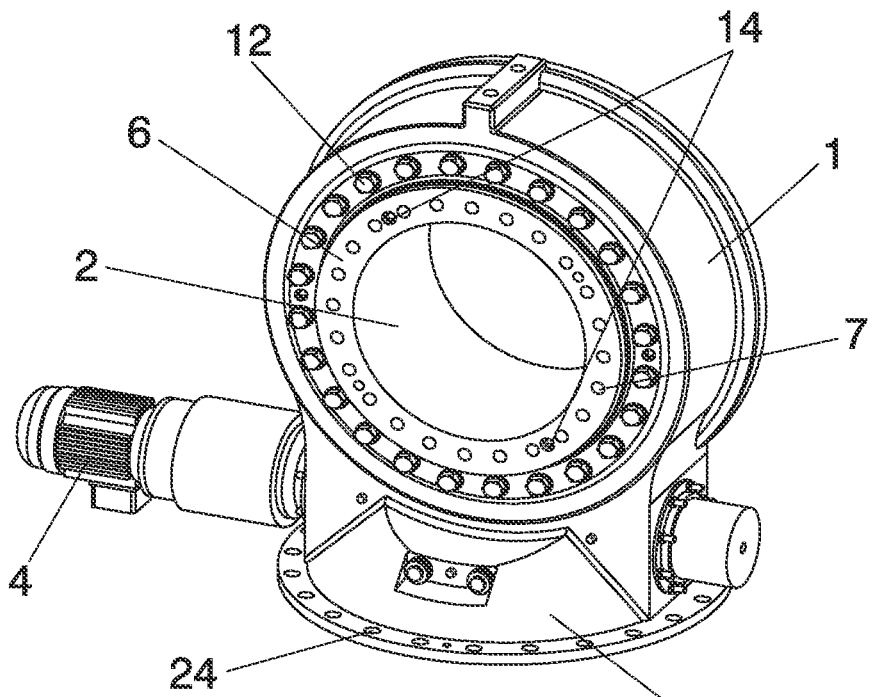
FIG. 3.—Shows a perspective view of the rear face of the rotation module properly mounted.

In FIGS. 1, 2 and 3 it can be observed how the structural casing (1) adopts an annular configuration and comprises a circular inner opening (16) with a diameter equivalent to the diameter of the circular projection (6) of the cylindrical body of the toothed crown (2) for its insertion in said face, so that it slightly emerges from the structural casing (1), the inner opening (16) of which is surrounded in its perimeter by a plurality of orifices (17) disposed in a position coinciding with the threaded holes (13) of the outer lateral surface of the circular ring (8), for its fixing by the set screws (12). On the other hand, the structural casing (1) comprises another opening (18) for the assembly of the toothed crown (2) in its interior, which is closed by a circular cover (19) provided with a central circular opening with a diameter equivalent to the diameter of the circular projection (6) of the body of the toothed crown (2), wherethrough it slightly emerges from the structural casing (1), the circular cover (19) of which comprises two series of orifices, one (20) in its outer perimeter for its fixing by threaded screws (21) to the body of the structural casing (1), and another (22) in its inner perimeter coinciding with the threaded holes (13) of the circular ring (8), for fixing the toothed crown to the structural casing (1) through the circular cover (19), by the threaded screws (12).

Finally, it should be indicated that the structural casing (1) comprises a circular base (23) disposed in orthogonal position with respect to the axis of rotation of the toothed crown (2), provided with a plurality of orifices (24) in its outer perimeter, for fixing directly to the main support mast of the solar panel, or through an axial rotation module.

The invention claimed is:

1. A zenithal rotation module for orienting solar panels, wherein the panels are intended to be supported by horizontal shafts, the module comprising:
   a structural casing having annular configuration;
   an endless screw;
   a motor for actuating the endless screw; and
   a toothed crown mounted inside the structural casing, and having;
      an inner cylindrical surface;
      a central annular protuberance;
      a toothing, located on the central annular protuberance, and configured so as to tangentially mesh with the endless screw; and
      a body, comprising:
         circular projections with cylindrical surfaces, and
         a plurality of threaded holes, located on the circular projections, for connecting the horizontal shafts so as to provide zenithal orientation to the solar panels,
   the zenithal rotation module further comprising:
      two circular rings, disposed in opposition on both sides of the central annular protuberance, on the cylindrical surfaces of the circular projections, for fastening the toothed crown inside de structural casing; the circular rings comprising an inner cylindrical surface and an outer lateral surface;
      a plurality of ball bearings;
      raceways of semicircular section, for locating the ball bearings, the raceways comprising:
         first raceways made in corresponding cylindrical surfaces of the circular projections, and
         second raceways located in the inner cylindrical surface of the circular rings, in correspondence with the first raceways, for establishing four points of contact with the bearings for supporting the radial loads,
      first ducts made in the body of the toothed crown, said ducts starting in the inner cylindrical surface of the toothed crown and ending in the first and second raceways, for allowing the bearings to be introduced in the first and second raceways, and
      a plurality of threaded holes located in the outer lateral surfaces of the circular rings for fixing the circular rings to the structural casing.

2. The module of claim 1, wherein the circular projections emerge laterally on both sides of the structural casing, for connecting the horizontal shafts, so as to provide zenithal orientation to the solar panels.

3. The module of claim 1, wherein the body further comprises a lateral edge, the module further comprising at least one second duct communicating the lateral edge of the body with the first and second raceways, for allowing the introduction of lubricating grease in the first and second raceways from the outside.

4. The module of claim 3, further comprising:
   grooves made on the toothed crown, and
   circular seals inserted on the grooves, between the toothed crown and the circular rings, for avoiding impurities entering the raceways.

5. The module of claim 1, further comprising:
   a circular inner opening, located on the structural casing, and having a diameter equivalent to the diameter of the circular projections,
   a plurality of first orifices located on the structural casing, perimetrally surrounding a first end of the inner opening, and coinciding with the threaded holes of the circular rings, for fixing the circular rings to the structural casing,
   a circular cover, located at a second end, opposing the first end, of the structural casing, for closing the structural casing,
   a circular opening, located on the circular cover, and having a diameter equivalent to the diameter of the circular projections,
   second orifices, located in an outer perimeter of the circular cover, for screw-fixing the circular cover to the body of the structural casing, and third orifices located on an inner perimeter of the circular cover, in coincidence with the threaded holes, for fixing the toothed crown to the structural casing through the circular cover.

6. The module of claim 1, wherein the structural casing further comprises:
a circular base, disposed in orthogonal position with respect to the axis of rotation of the toothed crown, and
a plurality of fourth orifices provided in an outer perimeter of the circular base, and intended for fixing the circular base to a main support mast of the solar panels, or to an axial rotation module which is intended to provide axial orientation to the solar panels.

* * * * *